(12) United States Patent
Bosboom et al.

(10) Patent No.: US 10,553,472 B2
(45) Date of Patent: Feb. 4, 2020

(54) APPARATUS, SYSTEM AND METHOD FOR PROVIDING A BERNOULLI-BASED SEMICONDUCTOR WAFER PRE-ALIGNER

(71) Applicants: Jeroen Bosboom, St. Petersburg, FL (US); Babak Naderi, St. Petersburg, FL (US); George Kovatchev, St. Petersburg, FL (US); Payman Rahimi, St. Petersburg, FL (US); Kwok Kuen Yu, St. Petersburg, FL (US)

(72) Inventors: Jeroen Bosboom, St. Petersburg, FL (US); Babak Naderi, St. Petersburg, FL (US); George Kovatchev, St. Petersburg, FL (US); Payman Rahimi, St. Petersburg, FL (US); Kwok Kuen Yu, St. Petersburg, FL (US)

(73) Assignee: JABIL INC., St. Petersburg, FL (US)

( * ) Notice: Subject to any disclaimer, the term of this patent is extended or adjusted under 35 U.S.C. 154(b) by 0 days.

(21) Appl. No.: 16/016,348

(22) Filed: Jun. 22, 2018

(65) Prior Publication Data
US 2019/0393070 A1 Dec. 26, 2019

(51) Int. Cl.
| B65G 49/07 | (2006.01) |
| B66C 1/02 | (2006.01) |
| H01L 21/687 | (2006.01) |
| H01L 21/683 | (2006.01) |
| H01L 21/67 | (2006.01) |
| H01L 21/68 | (2006.01) |
| H01L 21/677 | (2006.01) |

(52) U.S. Cl.
CPC .. *H01L 21/68707* (2013.01); *H01L 21/67265* (2013.01); *H01L 21/67718* (2013.01); *H01L 21/68* (2013.01); *H01L 21/6838* (2013.01)

(58) Field of Classification Search
CPC ......... H01L 21/68707; H01L 21/37742; H01L 21/67718; H01L 21/68; H01L 21/6838
USPC ............................... 294/213, 103.1; 414/941
See application file for complete search history.

(56) References Cited

U.S. PATENT DOCUMENTS

| 7,300,082 | B2 * | 11/2007 | Rogers | ........... | B25J 13/085 |
| | | | | | 294/104 |
| 7,520,545 | B2 * | 4/2009 | Kim | ........... | B65G 49/061 |
| | | | | | 294/213 |
| 7,611,182 | B2 * | 11/2009 | Kim | ........... | H01L 21/68707 |
| | | | | | 294/103.1 |
| 7,654,596 | B2 * | 2/2010 | Mantz | ........... | H01L 21/68707 |
| | | | | | 294/103.1 |
| 8,764,085 | B2 * | 7/2014 | Urabe | ........... | H01L 21/68707 |
| | | | | | 294/103.1 |
| 2006/0138793 | A1 * | 6/2006 | Tanae | ........... | B65G 47/91 |
| | | | | | 294/64.3 |

(Continued)

*Primary Examiner* — Paul T Chin
(74) *Attorney, Agent, or Firm* — Thomas J. McWilliams; Barnes & Thornburg LLP (57) ABSTRACT

An apparatus, system and method for providing a Bernoulli-based wafer pre-aligner. The pre-aligner may be capable of accommodating semiconductor wafers of varying sizes, and may include: a wafer support; a bearing arm capable of interfacing with at least one robotic element, and at least partially bearing the wafer support at one end thereof; and a plurality of Bernoulli pads on the wafer support for providing an interface between the wafer support and a one of the semiconductor wafers, wherein the interface comprises a gap there between.

19 Claims, 11 Drawing Sheets

(56) References Cited

U.S. PATENT DOCUMENTS

| | | | | |
|---|---|---|---|---|
| 2006/0157998 | A1* | 7/2006 | Gershenzon | H01L 21/68707 |
| | | | | 294/103.1 |
| 2007/0018469 | A1* | 1/2007 | Gershenzon | H01L 21/68707 |
| | | | | 294/103.1 |
| 2009/0096229 | A1* | 4/2009 | Bonora | H01L 21/6838 |
| | | | | 294/188 |
| 2011/0262257 | A1* | 10/2011 | Hino | B25J 9/042 |
| | | | | 414/744.5 |
| 2013/0341946 | A1* | 12/2013 | Yamanaka | B25J 15/008 |
| | | | | 294/213 |
| 2014/0227045 | A1* | 8/2014 | Iwasaka | H01L 21/6838 |
| | | | | 406/88 |
| 2014/0305217 | A1* | 10/2014 | Tapia | G01N 29/04 |
| | | | | 73/618 |
| 2015/0086316 | A1* | 3/2015 | Greenberg | H01L 21/6838 |
| | | | | 414/752.1 |
| 2015/0088300 | A1* | 3/2015 | Kilibarda | B05C 5/0216 |
| | | | | 700/186 |
| 2016/0247706 | A1* | 8/2016 | Ben-Natan | H01L 21/6838 |
| 2018/0161989 | A1* | 6/2018 | Bosboom | B25J 11/0095 |

* cited by examiner

APPARATUS, SYSTEM AND METHOD FOR PROVIDING A BERNOULLI-BASED SEMICONDUCTOR WAFER PRE-ALIGNER

BACKGROUND

Field of the Disclosure

The present disclosure relates to the transfer of articles, such as semiconductor wafers, and more particularly to a pre-aligner for gripping such wafers and a method for handling and transferring such wafers using the pre-aligner.

Description of the Background

The use of robotics is well established as a manufacturing expedient, particularly in applications where human handling is inefficient and/or undesirable. One such circumstance is in the semiconductor arts, in which robotics are used to handle wafers during various process steps. Such process steps may include, by way of example, chemical mechanical planarization (CMP), etching, deposition, passivation, and various other processes in which a sealed and/or "clean" environment must be maintained, such as to limit the likelihood of contamination and to ensure that various specific processing conditions are met.

Current practice in the semiconductor arts to robotically handle these wafers often includes the use of a pre-aligner operably attached to the robotics, such as in order to load semiconductor wafers from a loading stack into the various processing ports that may correspond to the aforementioned exemplary process steps. The robotics are employed to deploy the pre-aligner to retrieve the wafer from a particular port or stack, such as before and/or after processing in an associated process chamber. The wafer may thus be shuttled by the robotics connectively associated with the pre-aligner to subsequent ports for additional processing. When the wafer processing stages are complete, the robotics may then return the processed semiconductor wafer to a loading port, and may, again using the pre-aligner, then retrieve the next wafer for processing by the system. It is typical that a stack of several semiconductor wafers is processed in this manner using the pre-aligner during each process run.

Typical pre-aligners hold the wafer on its bottom side, such as using backside suction provided by, for example, vacuum draw eyelets on the pre-aligner. The application of other mechanical forces in addition to the vacuum port directly to the wafer is atypical, in part because the application of additional mechanical forces is generally understood to have a high likelihood of damaging or contaminating the wafer. However, even physical contact by this vacuum port alone may cause damage or contamination to the wafer in some cases.

Accordingly, there is a need for a pre-aligner that may readily handle and transfer very thin semiconductor wafers, preferably of multiple wafer sizes and for multiple process steps, without damaging or contaminating such wafers, and without use of the typical vacuum draw suction in the known art that may damage or warp such wafers.

SUMMARY

Certain embodiments are and include an apparatus, system and method for providing a pre-aligner. The pre-aligner may be capable of accommodating semiconductor wafers of varying sizes, and may include: a wafer support; a bearing arm capable of interfacing with at least one robotic element, and at least partially bearing the wafer support at one end thereof; and a plurality of Bernoulli pads on the wafer support for providing an interface between the wafer support and a one of the semiconductor wafers, wherein the interface comprises a gap therebetween.

The wafer support may be a fork. The varying sizes of accommodated wafers may be 200 mm or 300 mm, for example. The gap may be in a range of about 40 microns in height, although other gaps are suitable for use in the embodiments.

The plurality of Bernoulli pads may comprise at least four pads. At least two of the support pads may be proximal to the bearing arm, and at least two others of the support pads may be distal to the bearing arm.

The bearing arm may include a rotating wrist module. The rotating wrist module may be capable of rotating the interfaced one of the semiconductor wafer through 360 degrees. The wrist module may include at least one servo motor suitable to execute the rotating.

The pre-aligner may further include a wafer indexer for indexing the interfaced semiconductor wafer. The wafer indexer may comprise at least one index drive, and at least one index slide associated with the index drive capable of varying a position of the interfaced semiconductor wafer in relation to the wafer indexer. The at least one index slide may be capable of multi-axis sliding.

The pre-aligner may further include a modular feature on an underside of the wafer support suitable to distally expand and contract the wafer support. The modular feature may comprise a telescoping feature.

Thus, the disclosure provides at least an apparatus, system and method for providing a pre-aligner that may readily handle and transfer very thin semiconductor wafers of multiple wafer sizes and for multiple process steps, without damaging or contaminating such wafers.

BRIEF DESCRIPTION OF THE DRAWINGS

The exemplary compositions, systems, and methods shall be described hereinafter with reference to the attached drawings, which are given as non-limiting examples only, in which.

DETAILED DESCRIPTION

The figures and descriptions provided herein may have been simplified to illustrate aspects that are relevant for a clear understanding of the herein described apparatuses, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, for the sake of brevity a discussion of such elements and operations may not be provided herein. However, the present disclosure is deemed to nevertheless include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the disclosed embodiments should not be construed to limit the scope of the disclosure. As referenced above, in some embodiments, well-known processes, well-known device structures, and well-known technologies may not be described in detail.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on", "upon", "connected to" or "coupled to" another element or layer, it may be directly on, upon, connected or coupled to the other element or layer, or intervening elements or layers may be present, unless clearly indicated otherwise. In contrast, when an element or layer is referred to as being "directly on," "directly upon", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). Further, as used herein the term "and/or" includes any and all combinations of one or more of the associated listed items.

Yet further, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Thus, terms such as "first," "second," and other numerical terms when used herein do not imply a sequence or order unless clearly indicated by the context. Thus, a first element, component, region, layer or section discussed below could be termed a second element, component, region, layer or section without departing from the teachings of the embodiments.

Figure 1:
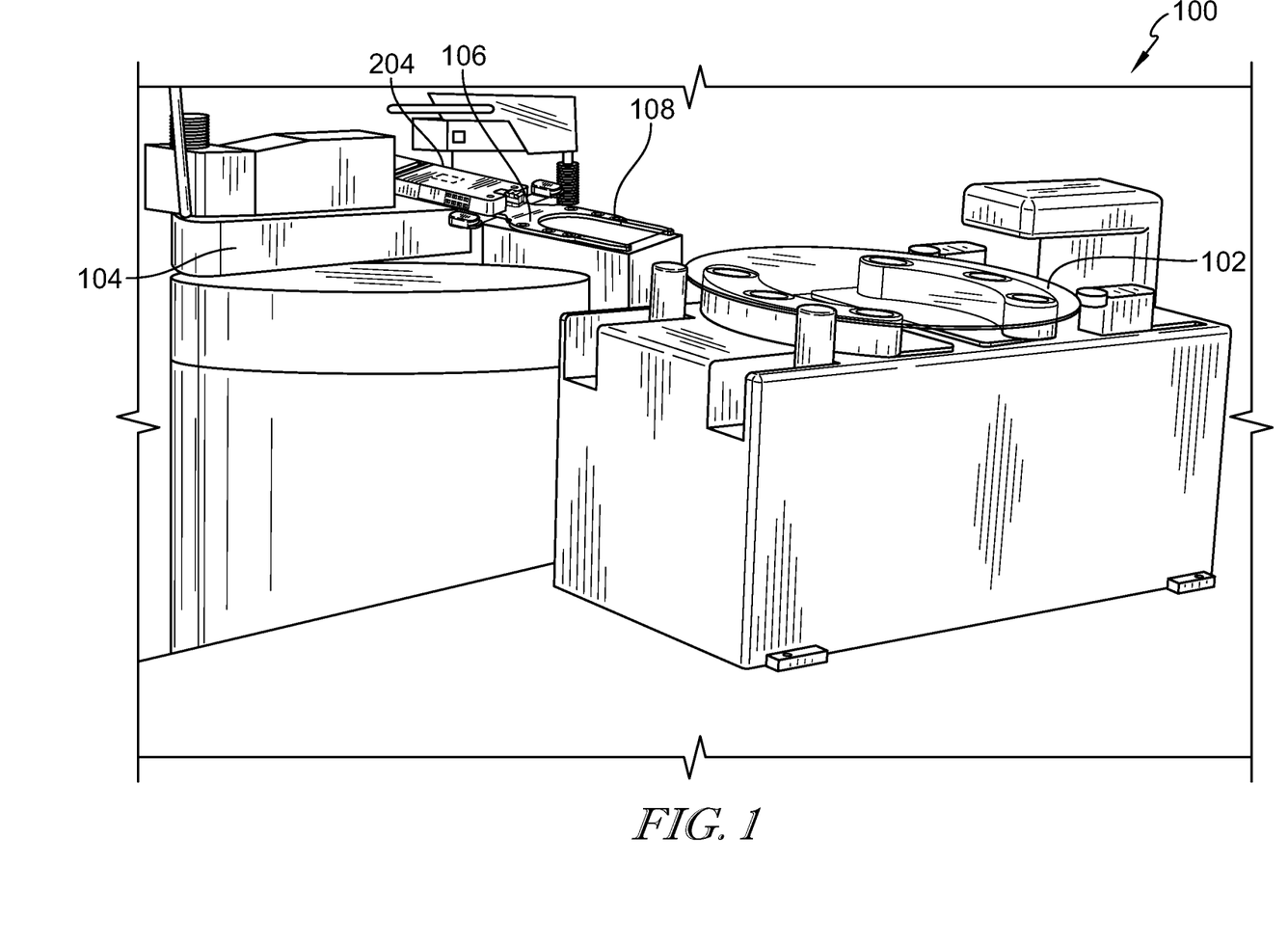
FIG. 1 is an illustration of a wafer handling system.

FIG. 1 illustrates an automated wafer handling system 100 suitable to precisely handle semiconductor wafers or substrates 102, such as silicon wafers, of varying diameters, compositions and physical attributes. The handling system 100 may be capable of supplying wafers 102 in a rapid, ordered succession for wafer processing. The wafers 102 supplied may be manipulated or transferred among various locations for processing, in part, by robotics, such as a robotic arm 104, equipped with an edge grip pre-aligner 106 adapted to perform the aforementioned manipulation and transfer.

The robotic arm 104 and pre-aligner 106 cooperate to place and remove wafers 102 to and from wafer processes, one or more wafer aligners, and one or more wafer cassettes, by way of non-limiting example. To that end, the pre-aligner 106 may include one or more securing points 108 to securely hold a subject wafer 102 in the vertical, horizontal, and inverted orientations required during wafer processing, in addition to providing or supplementing the various wafer gripping aspects discussed herein throughout.

As such, the example of FIG. 1 illustrates a system 100 in which the exemplary pre-aligners 106 disclosed herein below may be operable. In short, the illustrated edge grip pre-aligner 106, which is representative of the various types of pre-aligners 106 discussed below, may retrieve wafers 102 from one or more cassettes, such as for clocking of the retrieved wafers with a process aligner/pre-aligner, and/or subsequently with various wafer processes. More particularly, the various pre-aligner types provided in certain of the embodiments may provide for use of a single pre-aligner 106 with multiple different wafer diameters through the various referenced wafer processes.

Not only do semiconductor wafers vary in diameter, they are also typically manufactured according to standardized specifications which, among other dimensional tolerances including the diameter, require the surface for receiving device builds thereon to be substantially planar, such as with a flatness of 1.5 microns or less. Further and by way of example, 200 mm silicon wafers, for example, have a standard diameter of 200+/−0.2 mm and a standard thickness such as 675+/−25 microns. A typical wafer thickness after processing may range from about 500 microns to about 700 microns. Additionally, silicon wafers may be provided with a specific flat or a notch used for alignment and/or indicative of crystalline orientation. Hence, maintenance of wafer flatness during interaction of the wafer with the pre-aligner 106 is key to obtaining acceptable levels of wafer throughput and waste.

Thinner wafers may be particularly useful for certain integrated circuit applications, especially in those applications that necessitate more minimal thicknesses after processing. However, wafer processing may introduce warpage or bowing that exceeds the allowable flatness, and some wafers may have warpage or bowing beyond the desirable levels even in an unprocessed state. Moreover, warpage or bending may cause improper placement or alignment of the aforementioned alignment flat or notch. In such cases, wafer processing may be adversely affected by the warpage or bending, and these adverse effects may be exacerbated by any warpage or bending imparted by pre-aligner 106.

The foregoing issues resultant from warpage and bowing may be particularly exacerbated for thinner wafers. Accounting for flatness beyond variance is thus a significant issue in modern wafer processing, and the ability to account for flatness variance is yet more significant and complex in wafer handlers that allow for different wafer sizes for wafer processing. Thus, the providing of a pre-aligner 106 that minimizes the impact of interaction by the pre-aligner on wafer flatness, and that perhaps even provides remediation of wafer warpage, is highly advantageous in the disclosed embodiments.

A bearing arm 204 may associate the pre-aligner 106 with the robotic arm 104. The bearing arm 204 may include, for example, electronic circuitry for actuating one or more electromechanical elements within or on the bearing arm 204, such as for causing the physical association of the fork portion 106a of the pre-aligner with a wafer 102. The bearing arm 204 may additionally include sensors, processing capabilities, computer memory, networking capabilities, such as wireless connectivity, unique identifications (such as RF identification), process counters, electromechanical interactions with the robotic arm 104, batteries, such as high-density rechargeable batteries, and the like.

Disclosed embodiments and equivalents thereof may be directed to pre-aligners 106 that may be robot 104 mounted, as referenced above, or that may be "bench mounted", i.e., that may me mounted on a workstation bench at which a processing function or functions is carried out on a wafer 102. In either case, the pre-aligner 106 must retain the wafer 102 in physical association with the pre-aligner 106, using the referenced securing points 108, to allow for bench and/or robotic processing of the wafer 102, but this physical association should avoid, if possible, physical contact with the wafer 102, while also avoiding warpage of large and/or thin wafers.

More particularly, embodiments may include non-contact Bernoulli pads 108 acting as wafer securing points 108, wherein these Bernoulli pads 108 grip the subject wafer 102 without physical contact between the wafer 102 and the pre-aligner 106. As used herein, the Bernoulli pads 108 may be of any suitable size and shape so as to provide the Bernoulli affect discussed herein throughout. Moreover, any number of Bernoulli pads 108 suitable to grip a wafer, such as based on its size and weight, and given any rotational movement of the wafer 102 required by the wafer process, may be provided in the embodiments, such as the numbers of pads 108 shown in the attached drawings and discussed throughout, such as between four and eight pads 108. The flexible, non-contact alignment of wafers 102 provided by the Bernoulli pads 108 of the disclosed pre-aligner 106 saves time and is thus more efficient than prior known methodologies.

Embodiments may additionally provide a modular Bernoulli pre-aligner 302 that enables the pre-aligner to interact with multiple different sizes of wafers 102. Further, the provided pre-aligner 302 may use wafer mapping more efficiently than the known art, in part, due to the noncontact nature of the Bernoulli pads 108 employed, and may provide one or more features to improve the efficiency of wafer diagnostics provided in association with the pre-aligner 106, 302, such as by providing a wireless interface on the pre-aligner 106, 302 in order to simplify integration of the pre-aligner 106, 302 with other aspects of wafer processing.

Figure 2:
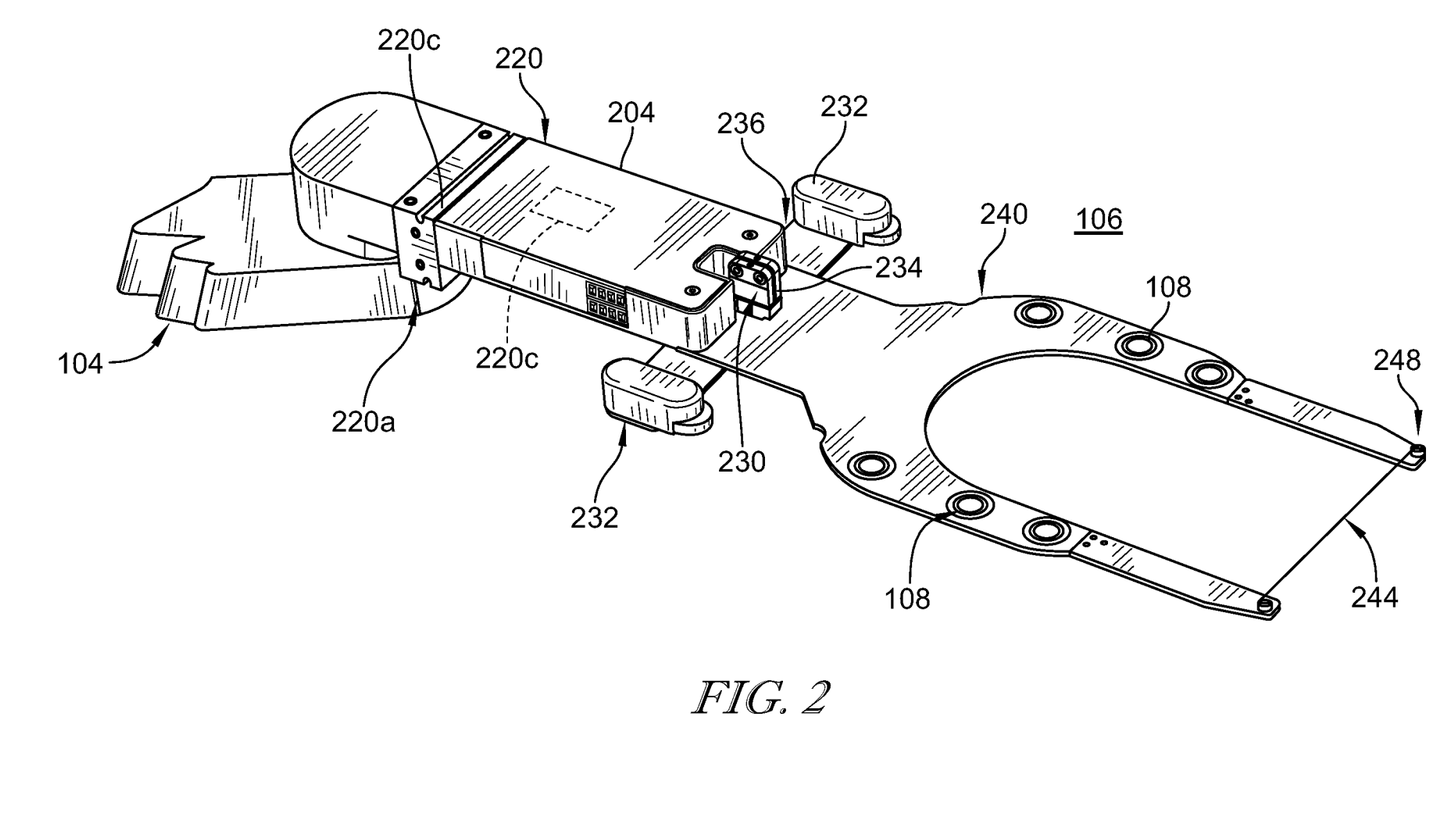
FIG. 2 is an illustration of aspects of a pre-aligner.

FIG. 2 illustrates an exemplary embodiment of a Bernoulli pre-aligner 106. Of note, the embodiment of pre-aligner 106 shown may be suitable for robotic mounting, such as in association with robotic arm 104. Further, the illustrated embodiment may include a bearing arm 204 in the form of a "wrist" module 220 which, in conjunction with the Bernoulli noncontact vacuum provided by the pads 108, may allow for a wafer 102 associated with the pre-aligner 106 to be flipped over such that wafer processing may be enhanced and improved.

More specifically, FIG. 2 illustrates the association of the pre-aligner 106 with robotic arm 104 via wrist module 220. Of course, the pre-aligner 106 may be associated with the robotic arm 104 via any known type of bearing arm 204, such as a fixed flange, by way of non-limiting example.

The wrist module 220 may be actuated so as to allow for the wafer 102 associated with the pre-aligner 106, and thereby the pre-aligner 106 itself, to be flipped over and/or held at an angle during the course of wafer processing of wafer 102. The wrist module 220 may thus include an actuator 220a in physical association with the pre-aligner 106 via a rotating wrist block 220b, wherein one or more electrical, electromechanical, or mechanical elements 220c, such as for control and actuation of wrist module 220, may be protectively housed within the wrist block 220b.

By way of example, electrically and mechanically associated with the wrist block 220b may be a wafer indexer 230 for indexing the wafer 102 associated with the pre-aligner 106 during processing. More particularly, the indexer 230 may include one or more index drives 232 that index the wafer 102 during processing, such as under the control or instruction of the elements 220c within wrist block 220b. As will be appreciated, multiple index drives 232 may allow more continuous and seamless indexing drive between flats and notches, by way of non limiting example.

Further, an indexing sensor 234 may be provided in order to sense the indexed location of the wafer 102 associated with the pre-aligner 106. Aspects of the indexer 230 may additional include an index drive slide 236 that may allow for expansion or contraction of the aspects of the indexer 230 distal to the elements 220c, such as, more particularly, the index drive(s) 232, such as so that the indexer 230 may accommodate wafers 102 of various sizes.

Further illustrated is a modular fork 240 for association with the Bernoulli pre-aligner 106. As will be appreciated, this modular fork 240 may expand or contract, such as manually or automatically, to associate wafers 102 of different sizes with the pre-aligner 106. Of note, the modular fork 240, although discussed and illustrated herein as associated with a Bernoulli pre-aligner 106, may be employed with pre-aligners of other known types.

Additionally associated with at least the fork 240 (which may or may not be modular) of the pre-aligner 106 are at least two Bernoulli vacuum pads 108. As will be understood to the skilled artisan, Bernoulli pads 108, such as those illustrated, provide a noncontact vacuum for holding a wafer 102 associated with the disclosed pre-aligner 106. More particularly, such Bernoulli pads 108 may employ a back pressure vacuum that allows for maintenance of, for example, a physical gap in the range of 40 microns between the wafer 102 and each Bernoulli pad 108 in the disclosed embodiments. It will be appreciated by the skilled artisan, in light of the discussion herein, that the gap maintained in association with the embodiments may vary without departing from the disclosure, such as due to variability in the Bernoulli pad size, variability in the back pressure, variability in wafer sizes associated with the pre-aligner, and so on.

The pre-aligner 106 may additionally include one or more wafer mapping elements 244. Yet further, the distal-most portion of the fork 240 of the pre-aligner 106 discussed throughout may include one or more wafer retention elements 248, such as the tip rollers 248 illustrated in FIG. 2. It will be understood that, although tip rollers 248 are shown in the illustration by way of example, other types of retention elements 248, may be used without departing from the disclosure.

Figure 3:
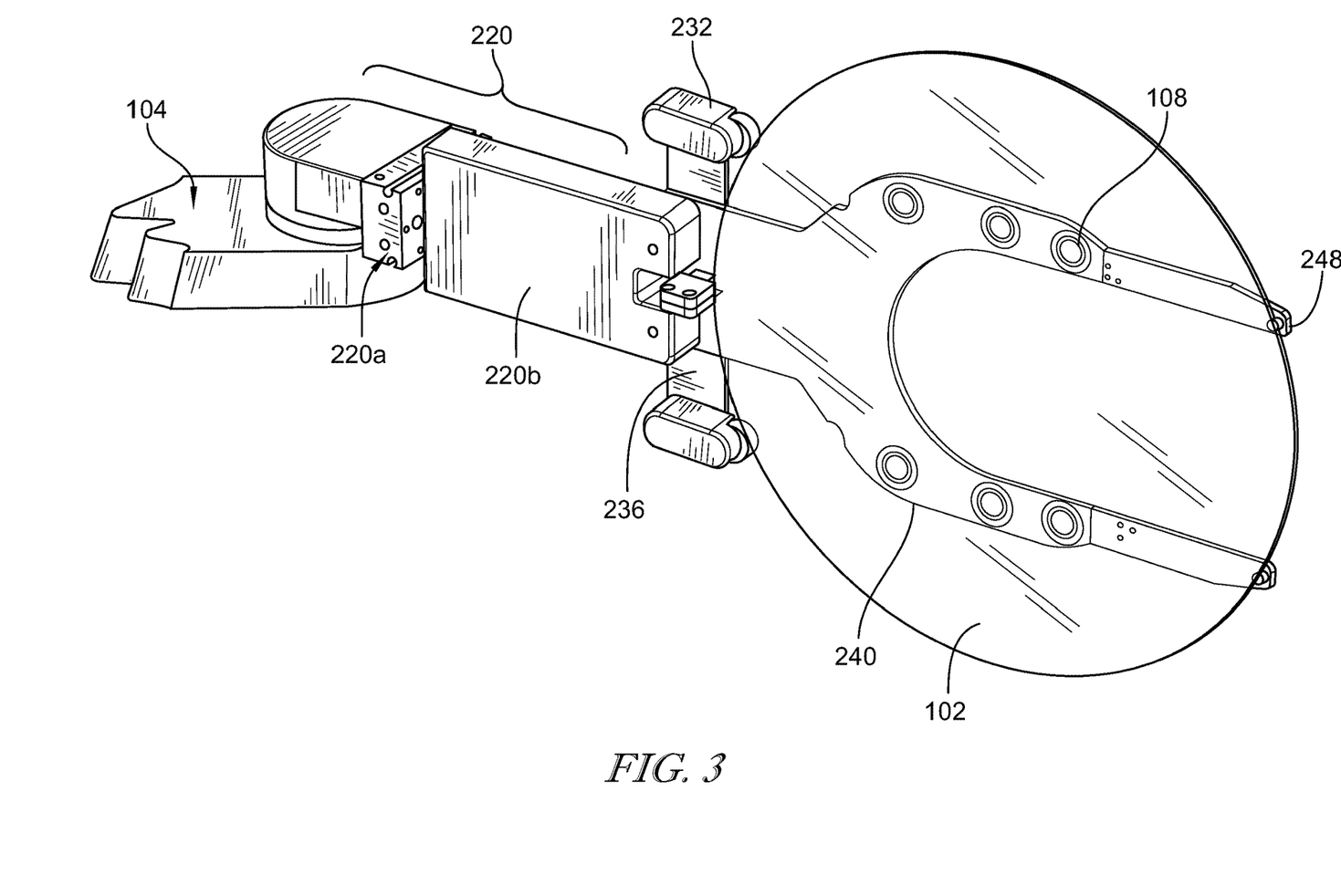
FIG. 3 is an illustration of aspects of a pre-aligner.

FIG. 3 illustrates actuation of the wrist module 220 discussed above with respect to FIG. 2. In this illustration, the wrist module 220 has been actuated to cause a 90° rotation of the wrist block 220b. Accordingly, the wafer 102 shown in Bernoulli association with the pre-aligner 106 has been rotated 90° in correspondence with the rotation of the wrist block 220b. Of note and as referenced, the use of the Bernoulli pads 108 discussed throughout provides a sufficiently strong noncontact vacuum to allow for this 90 degree rotation of the wafer 102.

Figure 4:
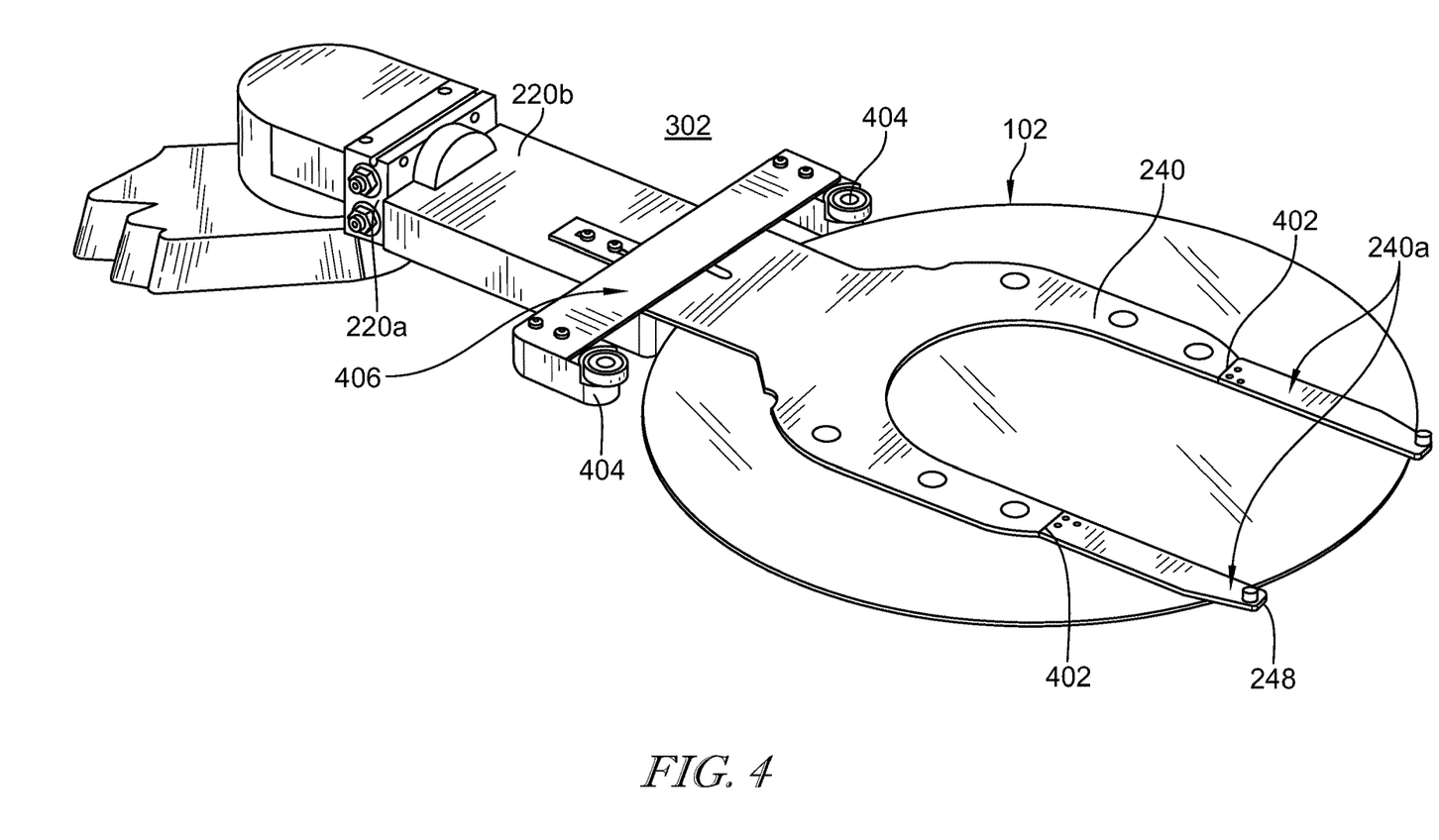
FIG. 4 is an illustration of aspects of a pre-aligner.

FIG. 4 illustrates a 180° rotation of the wafer 102 associated with pre-aligner 302 by the wrist block 220b. That is, the wrist block 220b illustrated is rotated by 180° from its initial position by actuation of the wrist actuator 220a associated with the wrist module 220, and correspondingly a wafer 102 associated by Bernoulli pads 108 with fork 240 would also be rotated by 180 degrees from its original, "face-up", horizontal position. In accordance with the disclosure, the wrist actuator 220b may comprise, by way of non-limiting example, a multi-stop pneumatic or servo motor.

Also evident in FIG. 4 is at least one modular feature 402 of the illustrated pre-aligner 302. In the illustration, one or more modular features 402 are included on the "underside" of the pre-aligner 302 at its initial position, i.e., the side of the fork 240 opposite the wafer 102. In the illustration, the portions of the fork 240 are modular in that the distal fork aspects 240a may be extended distally from the wrist block 220b pursuant to actuation of modular features 402.

Further and as illustrated, the index drives 404 are shown in association with at least one modular index slide 406 that may be actuated in correspondence with wafer size. For example, the illustrated wafer 102 may be 300 millimeters, and the index slide 406 may slide forward until the index drives 404 are brought into edge association with the wafer 102, such that the index drives 404 may index the wafer 102 associated with the pre-aligner 302 for processing.

In short, the modular pre-aligner 302 may additionally include, acting as modular features 402, one or more of modular tips on the distal portion of fork 240, and a modular actuated clamping system to move the index drives 404 into association with wafers 102 of varying sizes held on fork 240 by the Bernoulli pads 108. That is, some modular embodiments may include only edge gripping of the wafer 102 by the distal tips 248, such as the tip rollers discussed above, and by the proximal indexing drives 404, and thus gripping may occur without any physical contact with the working surface of the wafer 102, including by the Bernoulli pads 108. Thus, the major processing surface of a wafer 102 associated with the embodiments may remain untouched physically, and hence non-contaminated.

Figure 5:
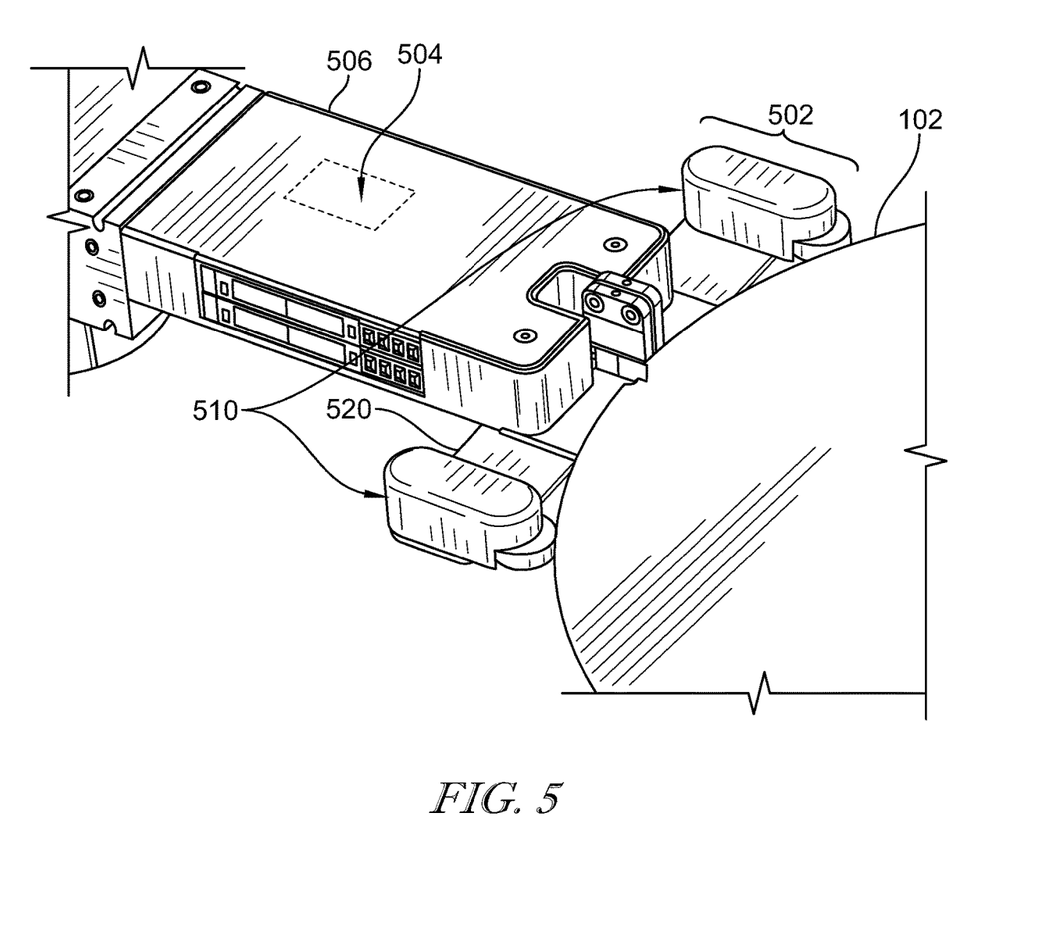
FIG. 5 is an illustration of aspects of a pre-aligner.

FIG. 5 illustrates with particularity an embodiment of a wafer indexer 502. In the illustration, electronics 504 for the indexer 502, such as may include wireless inputs and outputs, may be housed within the wrist block 506. An indexing sensor 508 may inter-communicate with these electronics 504, and may reside substantially centered along an edge of the wrist block 506 proximal to the edge of the wafer 102 associated with the fork 240, by way of non-limiting example.

The index drives 510 illustrated at the outermost portion of the index slide 520 may be moved in one or more axes. For example, the index slide 520 may allow for the index drive 510 to slide outwardly farther away from the index sensor 508, and an indexer actuator may actuate the index slide 520 to allow for the index drives 510 to be simultaneously moved towards and away from the edge of the wafer 102.

Figure 6:
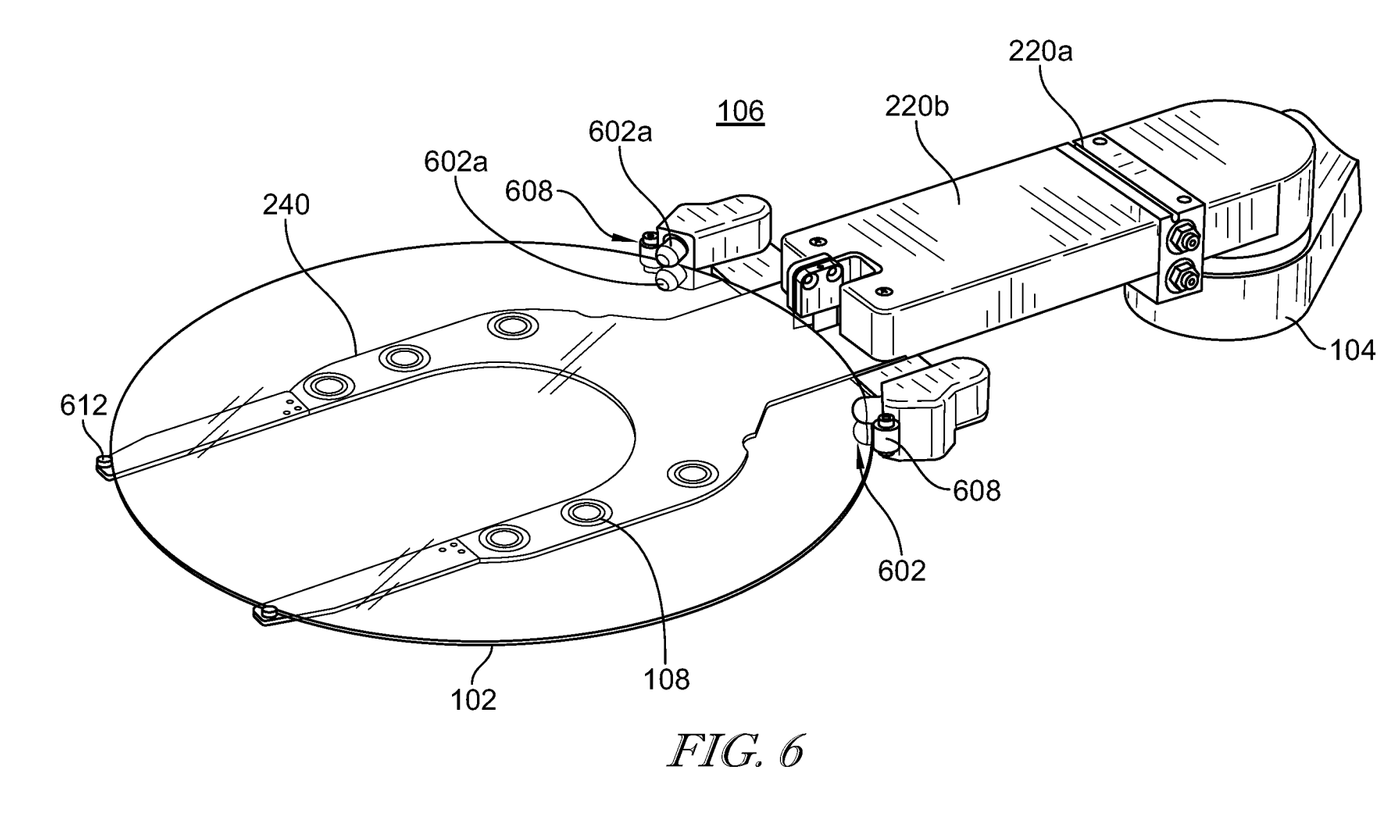
FIG. 6 is an illustration of aspects of a pre-aligner.

FIG. 6 illustrates an embodiment of the disclosed Bernoulli pre-aligner 106 having pinch roller index drives 602. It is often the case that particularly thin or warped wafers 102 are difficult to index. Accordingly and as shown, the index drives 602 herein may include top and bottom rollers 602a which may index a wafer 102 associated with the pre-aligner 106 by pinching the wafer 102 between the top and bottom rollers 602a of the index drive 602, and by indexing, i.e., rolling, either the top set of rollers 602a, or the bottom set of rollers 602a, or both sets of rollers 602a, to index the wafer 102. That is, the outside edge of the wafer 102 may be pinched between rollers 602a, such as in the exclusion zone thereof, and the rotation of the rollers 602a in a particular sequence may allow indexing of the pinched wafer 102 thereby. This provides significantly improved grip to index and rotate a wafer 102 associated with the disclosed pre-aligner 106 over the known art.

Also illustratively shown in FIG. 6 are guide rollers 608 at the outer portions of the index drives 602. These guide rollers 608 may rotate freely and/or may be actuated to act in a manner akin to the index drive rollers 602a discussed above. Further provided in the embodiments may be pinch rollers or other pinching grips 612, such as at the distal end of the fork arms (as shown), such that the grip on the wafer 102 associated with the Bernoulli pads 108 may be further improved, and the indexing and rotation of the wafer 102 further refined.

Figure 7A:
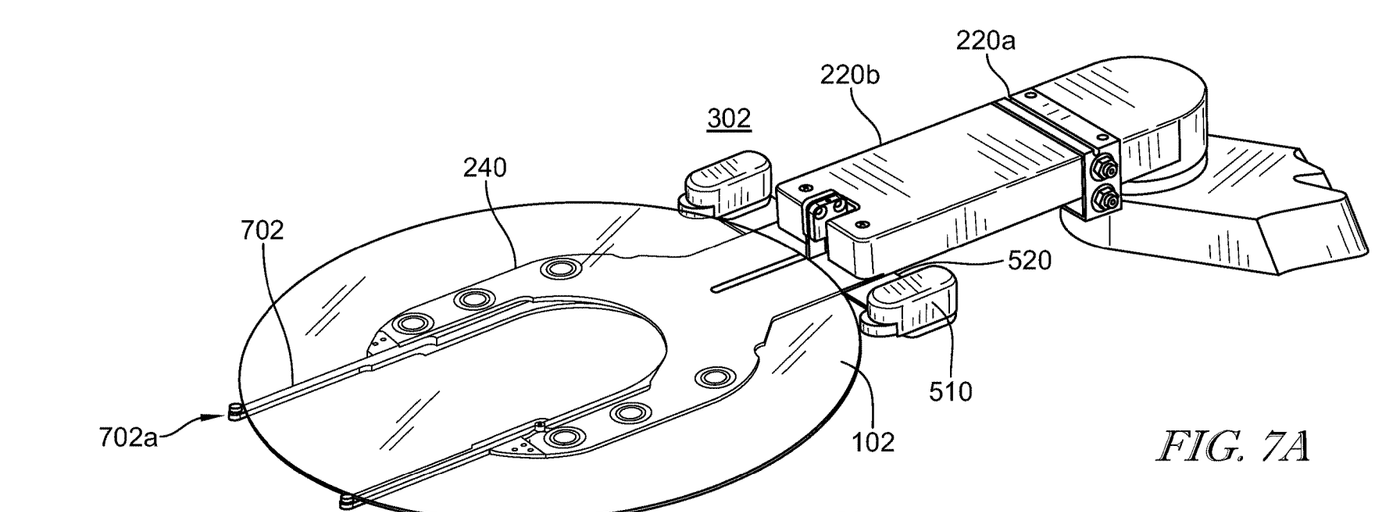
FIGS. 7A and 7B are illustrations of aspects of a pre-aligner.
Figure 7B:
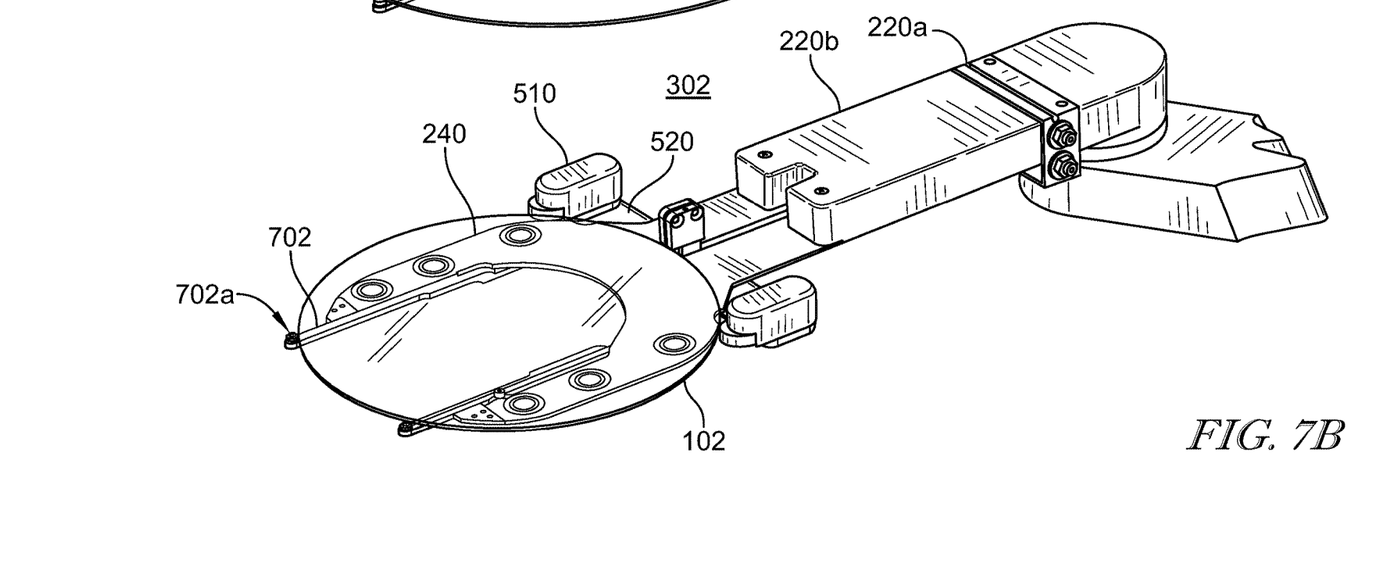

FIGS. 7A and 7B illustrate the telescoping of modular features 702 of a modular pre-aligner 302 having telescoping distal fork portions 240. In FIG. 7A, the telescoping features 702 are extended distally outward along the underside or inside of the fork portion 240, and in FIG. 7B the telescoping feature 702 is contracted inwardly, such as to allow for improved gripping of a smaller wafer 102. By way of non-limiting example, the telescoping fork illustrated may telescope outward for association with a 300 millimeter wafer, and may telescope inward for association with a 200 millimeter wafer.

The telescoping tips 702a of telescoping feature 702 may be autonomously or automatically operated, such as during wafer batch changeover. That is, the telescoping tips 702a may be telescoped outward automatically, such as by actuation of a servo motor associated with the wrist block 220b, and/or may be telescoped inward by a reversal of the same motor, such as upon sensing of a given wafer size to be associated with the pre-aligner 302, by way of non-limiting example. Alternatively, telescoping inward and outward may be done manually, or upon a user directive. Further, telescoping may have physical delimiters against which the telescoping abuts in the outward and inward telescoped positions, such as for enhanced positional control, and such as may be employed in automated or manual embodiments. Further, and as is evident in the embodiments of FIGS. 7A and 7B, the index drive slide 520 may also be adjusted based on the wafer size associated with the telescoping tips 702a. That is, the index drive slide 520 may slide the index drives 510 outwards towards the wafer 102, or back towards the wrist block 220b, and may further slide the index drives 510 away from one another, or closer to one another, by way of non-limiting example.

Figure 8:
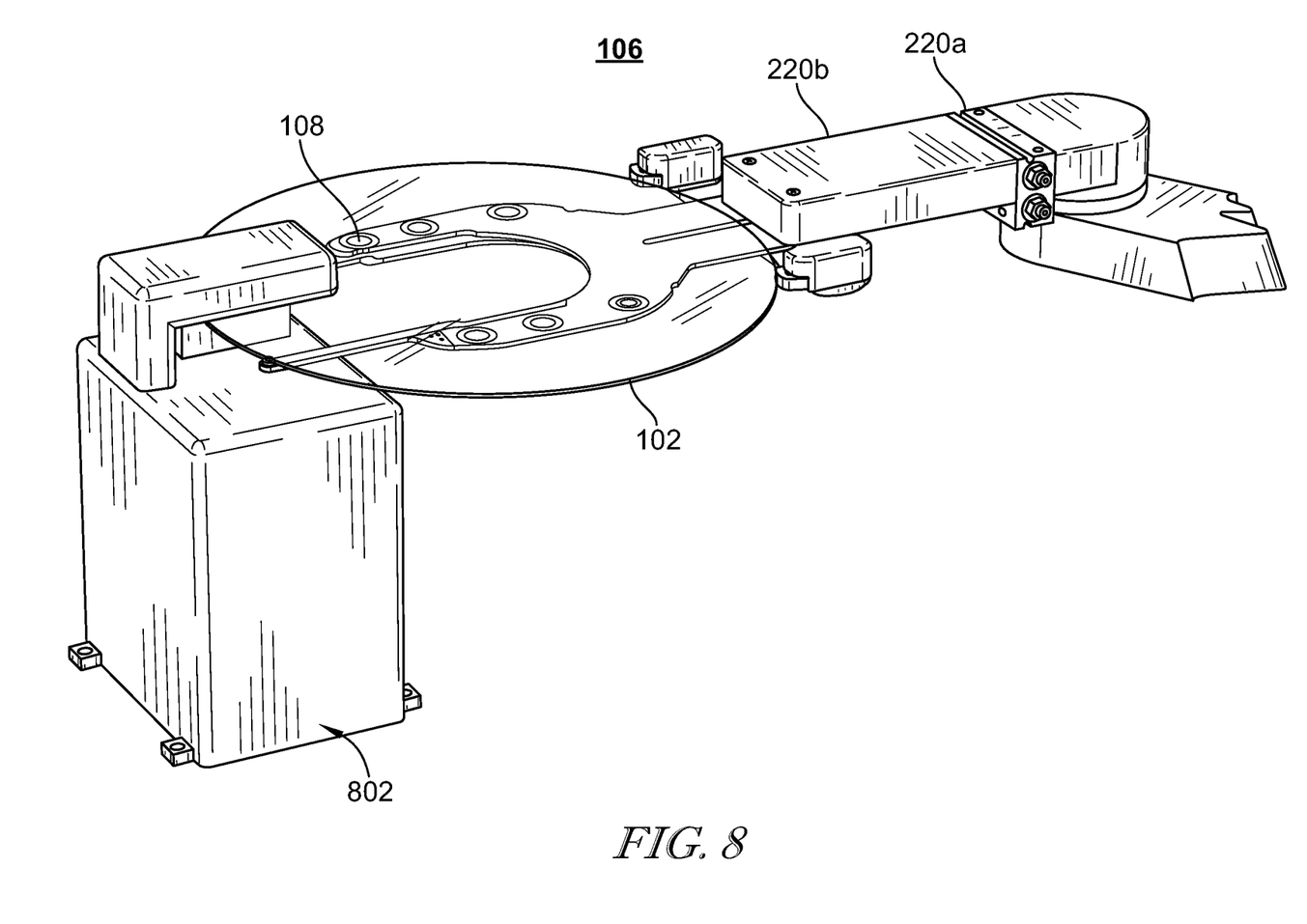
FIG. 8 is an illustration of aspects of a pre-aligner.

FIG. 8 illustrates an embodiment of the disclosed non-contact Bernoulli pre-aligner 106 as the wafer 102 associated with the pre-aligner 106 is moved into association with a fixed wafer mapper 802. As illustrated above, a wafer mapper may be associated with the pre-aligner 106, but in the embodiment of FIG. 8 a low-cost, high accuracy fixed wafer mapper 802 is provided in a manner physically separate from the wafer 102 and the pre-aligner 106. Such a fixed, separate wafer mapper 802 may provide for not only improved accuracy, but additionally may be more robust than a wafer mapper typically associated with, for example, the forked tip of the pre-aligner 106.

Figure 9A:
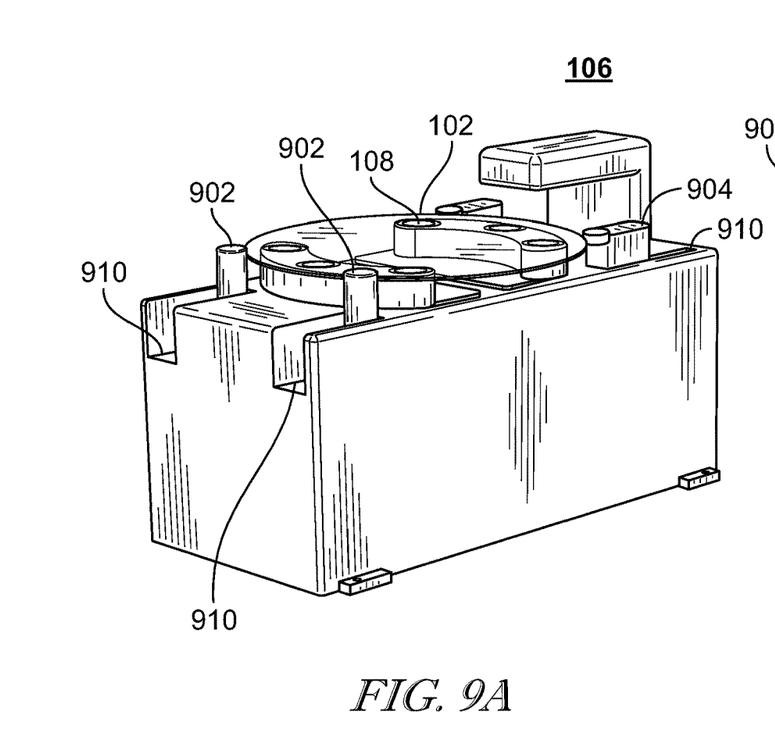
FIGS. 9A, 9B and 9C are illustrations of aspects of a base-mounted pre-aligner.
Figure 9B:
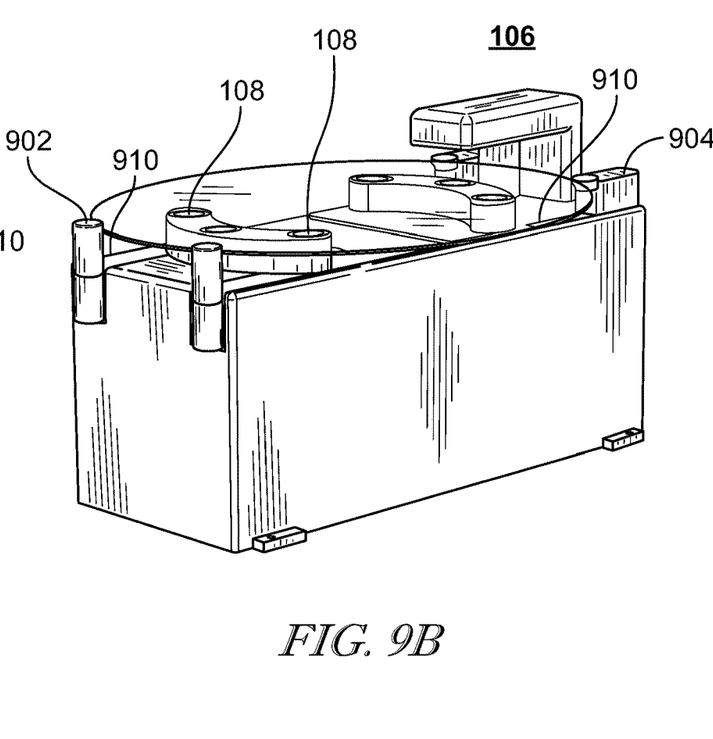
Figure 9C:
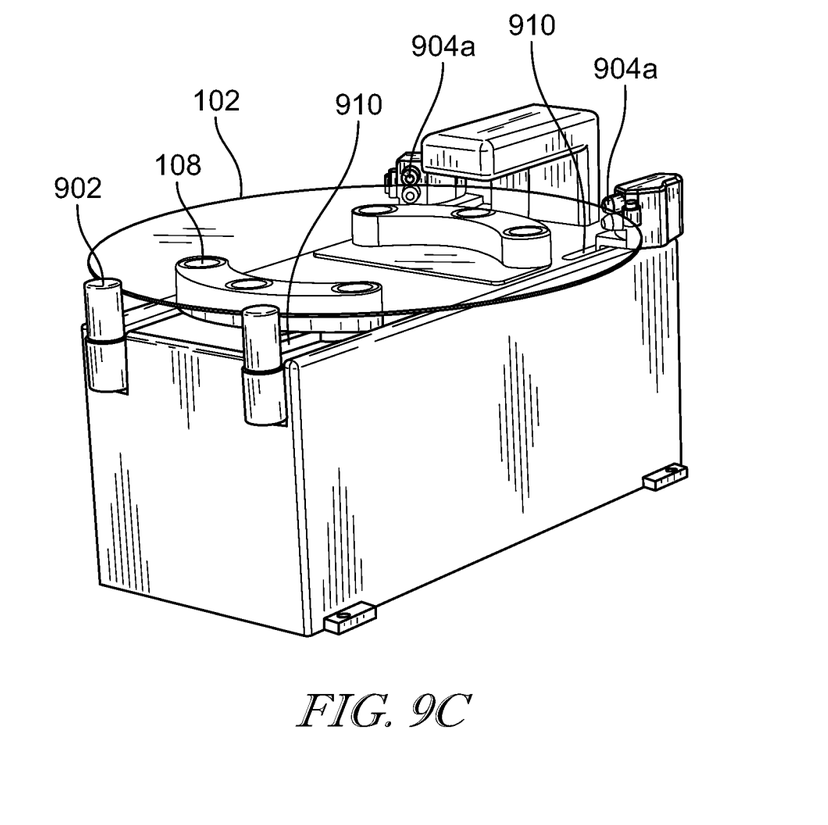

FIG. 9A and FIG. 9B illustrate small wafer and larger wafer configurations for a desktop/base-mounted Bernoulli noncontact pre-aligner 106. Of note, the base mounted pre-aligners of FIG. 9A and FIG. 9B may be employed with any one or more of the various configurations discussed herein, such as the pinch rollers discussed above. Further, and as shown, the base mounted Bernoulli pre-aligner 106 may provide a single or multiple adjustable end rollers 902, and a proximal index drive or drives 904, that may be adjustable in accordance with wafer size. More particularly, the end roller(s) 902 and/or one or more index drives 904 may be movable within slots 910 provided in the base 912, such as to accommodate different sizes of wafer. Thereby, the base 912 may include one or more actuators (not shown) for the end roller 902 and/or the index drives 904, such as one or more servo motors, that may autonomously adjust the end roller 902 and/or the index drive 904 or drives to suit various wafer configurations. As shown in FIG. 9C, the base-mounted Bernoulli pre-aligner may additionally include on or more pinch roller index drives 904a, as discussed above. Needless to say, any one or more of idle rollers 902 may include wafer orientation and/or position tracking capabilities, such as using embedded encoders, as referenced throughout.

The foregoing apparatuses, systems and methods may also include the control of the various robotic functionality referenced throughout. Such control may include, by way of non-limiting example, manual control using one or more user interfaces, such as a controller, a keyboard, a mouse, a touch screen, or the like, to allow a user to input instructions for execution by software code associated with the robotics and with the systems discussed herein. Additionally, and as is well known to those skilled in the art, system control may also be fully automated, such as wherein manual user interaction only occurs to "set up" and program the referenced functionality, i.e., a user may only initially program or upload computing code to carry out the predetermined movements and operational sequences discussed throughout. In either a manual or automated embodiment, or in any combination thereof, the control may be programmed, for example, to relate the known positions of wafers, the bearing arm, the fork portion, and so on.

Figure 10:
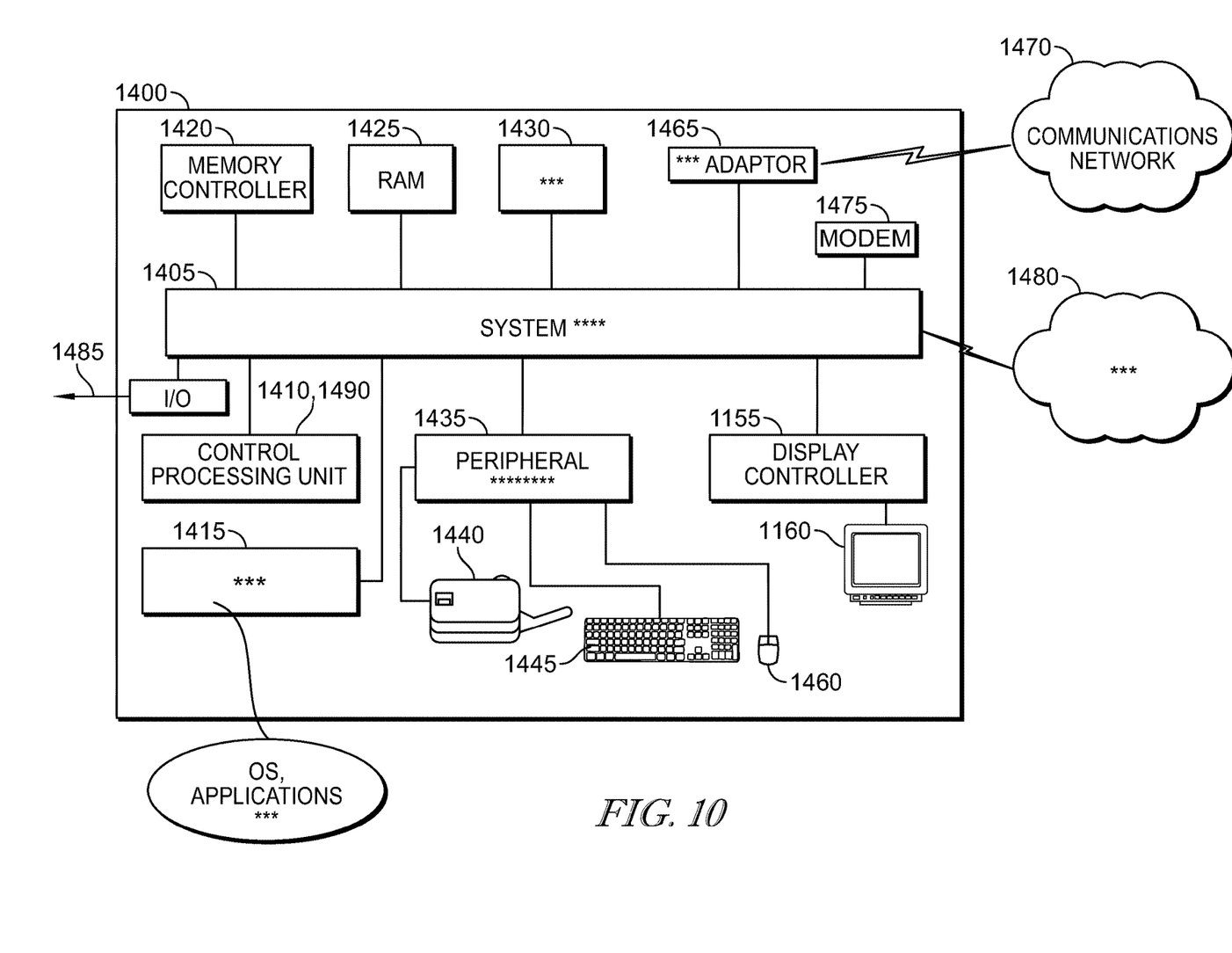
FIG. 10 illustrates a computing system suitable to implement aspects of the disclosure.

FIG. 10 illustrates an exemplary embodiment of a computer processing system 1400 that may be operably employed in embodiments discussed herein, including to program the robotic control, and that may accordingly perform the processing and logic discussed throughout. That is, the exemplary computing system 1400 is just one example of a system that may be used in accordance with herein described systems and methods.

Computing system 1400 is capable of executing software, such as an operating system (OS) and one or more computing applications 1490. The software may likewise be suitable for operating and/or monitoring hardware, such as via inputs/outputs (I/O), using said applications 1490.

The operation of exemplary computing system 1400 is controlled primarily by computer readable instructions, such as instructions stored in a computer readable storage medium, such as hard disk drive (HDD) 1415, optical disk (not shown) such as a CD or DVD, solid state drive (not shown) such as a USB "thumb drive," or the like. Such instructions may be executed within central processing unit (CPU) 1410 to cause computing system 1400 to perform the disclosed operations. In many known computer servers, workstations, PLCs, personal computers, mobile devices, and the like, CPU 1410 is implemented in an integrated circuit called a processor.

The various illustrative logics, logical blocks, modules, and engines, described in connection with the embodiments disclosed herein may be implemented or performed with any of a general purpose CPU, a digital signal processor (DSP), an application specific integrated circuit (ASIC), a field programmable gate array (FPGA) or other programmable logic device, discrete gate or transistor logic, discrete hardware components, or any combination thereof, respectively acting as CPU 1410. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is appreciated that, although exemplary computing system 1400 is shown to comprise a single CPU 1410, such description is merely illustrative, as computing system 400 may comprise a plurality of CPUs 1410. Additionally, computing system 1400 may exploit the resources of remote or parallel CPUs (not shown), for example, through local or remote communications network 1470 or some other data communications means.

In operation, CPU 1410 fetches, decodes, and executes instructions from a computer readable storage medium, such as HDD 1415. Such instructions can be included in the software, such as the operating system (OS), executable programs/applications, and the like. Information, such as computer instructions and other computer readable data, is transferred between components of computing system 1400 via the system's main data-transfer path. The main data-transfer path may use a system bus architecture 1405, although other computer architectures (not shown) can be used, such as architectures using serializers and deserializers and crossbar switches to communicate data between devices over serial communication paths.

System bus 1405 may include data lines for sending data, address lines for sending addresses, and control lines for sending interrupts and for operating the system bus. Some busses provide bus arbitration that regulates access to the bus by extension cards, controllers, and CPU 1410. Devices that attach to the busses and arbitrate access to the bus are called bus masters. Bus master support also allows multiprocessor configurations of the busses to be created by the addition of bus master adapters containing processors and support chips.

Memory devices coupled to system bus 1405 can include random access memory (RAM) 425 and read only memory (ROM) 1430. Such memories include circuitry that allows information to be stored and retrieved. ROMs 1430 generally contain stored data that cannot be modified. Data stored in RAM 1425 can generally be read or changed by CPU 1410 or other communicative hardware devices. Access to RAM 1425 and/or ROM 1430 may be controlled by memory controller 1420. Memory controller 1420 may provide an address translation function that translates virtual addresses into physical addresses as instructions are executed.

Memory controller 1420 may also provide a memory protection function that isolates processes within the system and that isolates system processes from user processes. Thus, a program running in user mode can normally access only memory mapped by its own process virtual address space; it cannot access memory within another process' virtual address space unless memory sharing between the processes has been set up.

The steps and/or actions described in connection with the aspects disclosed herein may be embodied directly in hardware, in a software module executed by a processor, or in a combination of the two, in communication with memory controller 1420 in order to gain the requisite performance instructions. That is, the described software modules to perform the functions and provide the directions discussed herein throughout may reside in RAM memory, flash memory, ROM memory, EPROM memory, EEPROM memory, registers, a hard disk, a removable disk, a CD-ROM, or any other form of storage medium known in the art. Any one or more of these exemplary storage medium may be coupled to the processor 1410, such that the processor can read information from, and write information to, that storage medium. In the alternative, the storage medium may be integral to the processor. Further, in some aspects, the processor and the storage medium may reside in an ASIC. Additionally, in some aspects, the steps and/or actions may reside as one or any combination or set of instructions on an external machine readable medium and/or computer readable medium as may be integrated through I/O port(s) 1485, such as a "flash" drive.

In addition, computing system 1400 may contain peripheral controller 1435 responsible for communicating instructions using a peripheral bus from CPU 1410 to peripherals and other hardware, such as printer 1440, keyboard 1445, and mouse 1450. An example of a peripheral bus is the Peripheral Component Interconnect (PCI) bus.

One or more hardware input/output (I/O) devices 1485 may be in communication with hardware controller 1490. This hardware communication and control may be implemented in a variety of ways and may include one or more computer busses and/or bridges and/or routers. The I/O devices controlled may include any type of port-based hardware (and may additionally comprise software, firmware, or the like), and can also include network adapters and/or mass storage devices from which the computer system 1400 can send and receive data for the purposes disclosed herein. The computer system 1400 may thus be in communication with the Internet or other networked devices/PLCs via the I/O devices 1485 and/or via communications network 1470.

Display 1460, which is controlled by display controller 1455, may optionally be used to display visual output generated by computing system 1400. Display controller 1455 may also control, or otherwise be communicative with, the display. Visual output may include text, graphics, animated graphics, and/or video, for example. Display 1460 may be implemented with a CRT-based video display, an LCD-based display, gas plasma-based display, touch-panel, or the like. Display controller 1455 includes electronic components required to generate a video signal that is sent for display.

Further, computing system 1400 may contain network adapter 1465 which may be used to couple computing system 1400 to an external communication network 1470, which may include or provide access to the Internet, and hence which may provide or include tracking of and access to the process data discussed herein. Communications network 1470 may provide access to computing system 1400 with means of communicating and transferring software and information electronically, and may be coupled directly to computing system 1400, or indirectly to computing system 1400, such as via PSTN or cellular network 1480. Additionally, communications network 1470 may provide for distributed processing, which involves several computers and the sharing of workloads or cooperative efforts in performing a task. It is appreciated that the network connections shown are exemplary and other means of establishing communications links between multiple computing systems 1400 may be used.

It is appreciated that exemplary computing system 1400 is merely illustrative of a computing environment in which the herein described systems and methods may operate, and thus does not limit the implementation of the herein described systems and methods in computing environments having differing components and configurations. That is, the concepts described herein may be implemented in various computing environments using various components and configurations.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein.

What is claimed is:

1. A pre-aligner capable of variably accommodating semiconductor wafers of varying sizes, comprising:
   a wafer support;
   a bearing arm capable of interfacing with at least one robotic element, and at least partially bearing the wafer support at one end thereof;
   a plurality of Bernoulli pads on the wafer support for providing an interface between the wafer support and one of the semiconductor wafers, wherein the interface comprises a gap therebetween; and
   the plurality of Bernoulli pads being present only on that portion of the accommodating aspect for smaller sizes of the semiconductor wafers, and being absent from that portion of the accommodating aspect for larger sizes of the semiconductor wafers.

2. The pre-aligner of claim 1, wherein the wafer support comprises a fork.

3. The pre-aligner of claim 1, wherein the varying sizes comprise up to 150 mm in diameter variation.

4. The pre-aligner of claim 1, wherein the gap is in a range of about 40 microns in height.

5. The pre-aligner of claim 1, wherein the plurality of Bernoulli pads comprises at least four pads.

6. The pre-aligner of claim 5, wherein at least two of the support pads are proximal to the bearing arm, and wherein at least two others of the support pads are distal to the bearing arm.

7. The pre-aligner of claim 1, further comprising a bench mount base that supports at least the bearing arm.

8. The pre-aligner of claim 1, wherein the bearing arm comprises a rotating wrist module.

9. The pre-aligner of claim 8, wherein the rotating wrist module is capable of rotating the interfaced one of the semiconductor wafer through 360 degrees.

10. The pre-aligner of claim 8, wherein the wrist module further comprises at least one servo motor suitable for executing rotating.

11. The pre-aligner of claim 1, further comprising a wafer indexer for indexing the interfaced semiconductor wafer.

12. The pre-aligner of claim 11, wherein the wafer indexer comprises at least one index drive, and at least one index slide associated with the index drive capable of varying a position of the interfaced semiconductor wafer in relation to the wafer indexer.

13. The pre-aligner of claim 12, wherein the at least one index slide is capable of multi-axis sliding.

14. The pre-aligner of claim 1, wherein the wafer support further comprises at least one distal wafer retention element.

15. The pre-aligner of claim 14, wherein the at least one distal wafer retention element comprises tip rollers.

16. The pre-aligner of claim 1, further comprising a modular feature on an underside of the wafer support suitable to distally expand and contract the wafer support.

17. The pre-aligner of claim 16, wherein the modular feature comprises a synchronous telescoping feature.

18. The pre-aligner of claim 1, wherein the bearing arm comprises a wireless communication interface.

19. The pre-aligner of claim 1, wherein the wafer support further comprises a wafer presence sensor.

* * * * *